United States Patent [19]

Keezer et al.

[11] 4,183,094

[45] Jan. 8, 1980

[54] OPTICAL STORAGE MEDIUM USING THE FREQUENCY DOMAIN

[75] Inventors: Richard C. Keezer, Los Altos; Ronald H. Geils, Palo Alto, both of Calif.

[73] Assignee: Xerox Corporation, Stamford, Conn.

[21] Appl. No.: 890,723

[22] Filed: Mar. 20, 1978

[51] Int. Cl.$^2$ ............................................. G11C 13/04
[52] U.S. Cl. ..................................... 365/127; 365/113
[58] Field of Search ...................... 365/113, 120, 127

[56] References Cited

U.S. PATENT DOCUMENTS 3,737,877   6/1973   Feinleib ............................. 365/113

OTHER PUBLICATIONS

Welber et al., Reading Information Stored in Chalcogenide Films, IBM Tech. Disclosure Bulletin, vol. 15, No. 5, 10/72, pp. 1588-1589.
Brodsky, Multilayer Memory Elements for Beam Addressable Memories, IBM Tech. Disclosure Bulletin, vol. 13, No. 10, 3/71, pp. 3001-3002.

*Primary Examiner*—Stuart N. Hecker
*Attorney, Agent, or Firm*—Leonard Zalman; W. Douglas Carothers, Jr.

[57] ABSTRACT

An optical storage medium in which the effect of optical interference is utilized to provide information storage. Heating of selected portions of the optical storage medium causes a permanent change in the wavelength and intensity of the interference fringes of the optical storage medium, and those changes give rise to large changes in light reflectivity at the initial interference fringe wavelengths, and hence gives rise to an optical pattern that is readily detectable. Preferred storage medium materials include alloys of the Ge-Se-S-Te group overlaying a metallic layer.

11 Claims, 11 Drawing Figures

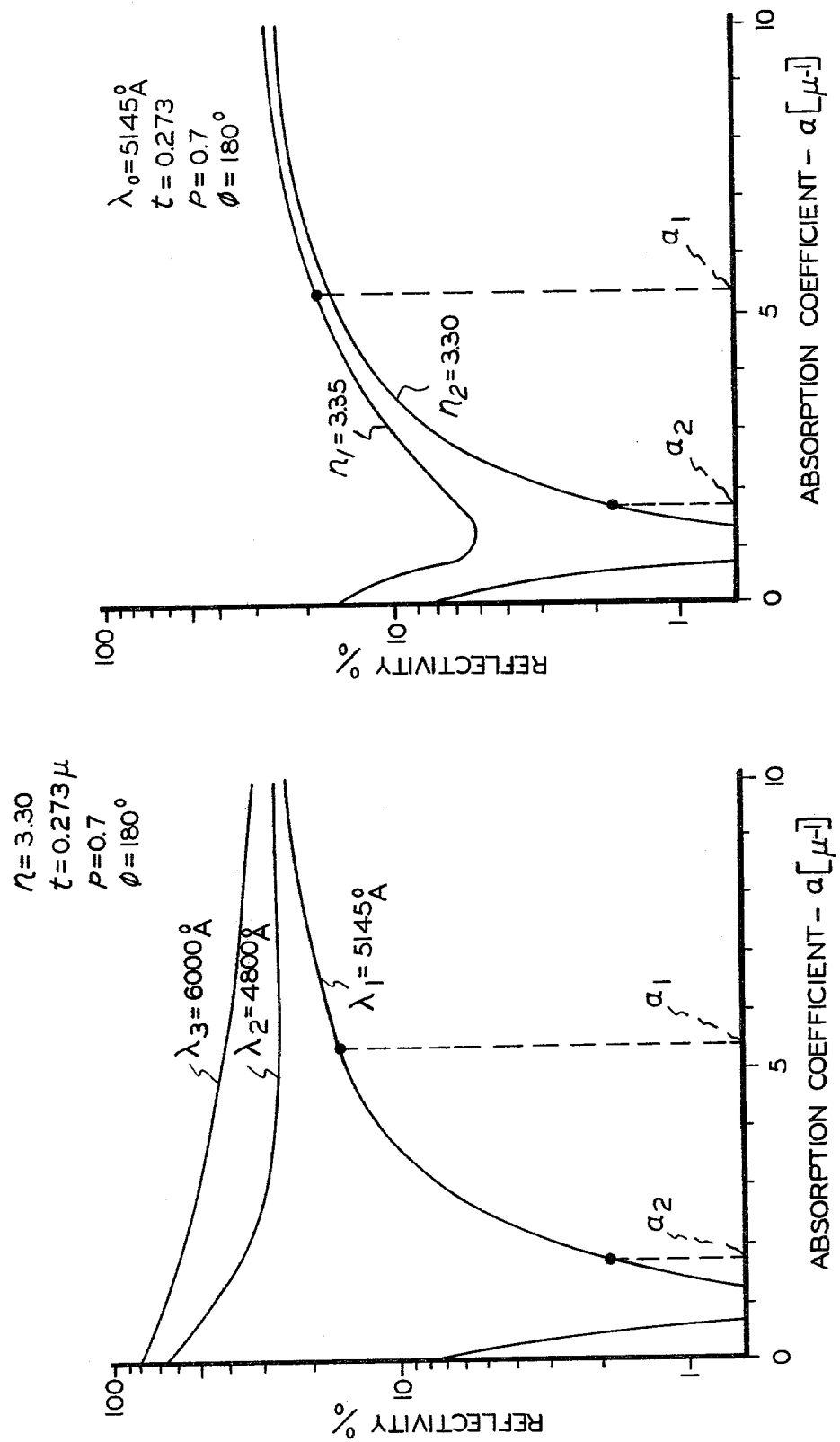

OPTICAL STORAGE MEDIUM USING THE FREQUENCY DOMAIN

BACKGROUND OF THE INVENTION

Memories presently utilized for the storage of data and other information are normally of two types. First, there are the inexpensive but slow disk, drum and tape memories which may be utilized for storing large quantities of information. With a magnetic disk, for example, as many as $10^9$ bits may be stored on a single disk at a cost of about a tenth of a cent per bit. However, random access time with a magnetic disk memory is in the order of $10^4$ to $10^5$ microseconds.

The second type of memories are the faster but far more costly core and semiconductor memories. Partly as a result of cost, these memories are not normally utilized for storing large quantities of information. Typically, a core memory might store $10^6$ bits at a cost of a cent a bit and have a random access time of about one microsecond. Semiconductor memories are normally adapted to store about $10^3$–$10^5$ bits at a cost of from one to ten cents a bit with a random access time approaching 0.1 microseconds.

From the above it is apparent that there is a wide disparity in cost, speed and capacity between the two different types of memories. Recent developments have suggested that optical memories may provide a vehicle for bridging this gap, providing random access times approaching those of core memories with capacities and per bit costs approaching those of disk memories.

Optical memories have been proposed in which data is permanently stored by laser beam ablation of small discrete regions of a thin film of a metallic storage material, for example a 500 Å thick film of bismuth. A disadvantage of the ablation type of optical memory is the high power required of the writing light beam since the writing light beam must have power sufficient to vaporize or melt the discrete regions of the storage material to provide the information indicative holes in the storage material. A factor in the high writing light beam power required for the ablation type of optical memory is that suitable metallic storage materials reflect a large percentage of the laser light beam impinging thereon and that reflected light does not contribute significantly to the melting or vaporization of the discrete regions of the storage material. A further disadvantage of the ablative type of optical memory is that the storage material is not frequency selective during readout and thus the system cannot distinguish between ablations purposely recorded and abrasions and destructions of portions of the storage material inadvertently produced during handling of the storage medium. The lack of frequency selectivity also complicates read during write and other error checking procedures. Furthermore, some storage materials undergo chemical changes in the presence of the atmosphere, for example, the oxidation of bismuth to a substantially non-reflecting oxide of bismuth, thereby making the detection of stored information extremely difficult.

Other types of optical memories utilize storage materials which can assume two or more physical states in response to applied heat. Since the different physical states will possess different optical properties, these storage materials have been able to function as optical information storage devices when used in the form of a thin film. However, these changes of state optical memories suffer from low readout efficiency and, like ablative type optical storage systems, do not have frequency selectivity and require high power laser beams to effect the change of physical state.

OBJECTS OF THE INVENTION

An object of the invention is to provide an improved optical storage medium.

A further object of the invention is to utilize the effect of optical interference in thin films to provide an optical storage medium.

A further object of the invention is to provide an interference type optical storage medium.

A still further object of the invention is to provide an interference type optical storage medium needing low laser power for recording.

SUMMARY OF THE INVENTION

In accordance with the invention, the effect of optical interference in thin films is utilized to provide an optical storage medium. For example, transmission interference filters are well known and widely used devices for transmitting selected, very narrow radiation bands while simultaneously rejecting undesired wavelength bands, the undesirable wavelength bands being rejected by interference phenomena rather than by absorption or scattering. The transmitted wavelength bands depend upon the thickness and optical parameters of the thin films comprising the filter. Interference effects are also observed in the reflected light from such devices, and the invention primarily concerns a reflectivity type device.

According to the invention, certain optical parameters of selected portions of a thin-film interference device are permanently changed by heating those portions with a focused, pulsed laser beam. This change in optical parameters after heating causes a permanent change in the wavelength and intensity of the interference fringes, and these changes give rise to a large change in reflectivity at the initial interference fringe wavelength, and hence give rise to an optical pattern that is readily detectable. One of the factors contributing to the wavelength location and intensity of interference fringes is the absorption coefficient to one of the thin film components of the interference device. The invention recognizes that discrete portions of one of the thin film components of an interference device can be changed by heating, with the resultant change in location of interference fringes and the permanent storage of information which is detected by determining whether the discrete portions of the interference device which have been heated have a high or low reflectivity at a given wavelength.

Utilization of the phenomena of interference devices in optical memories provides a memory which (1) requires low laser power for recording, (2) has reliable error checking capabilities and frequency selectivity, and (3) long shelf life even when stored in the atmosphere. The low power capability is possible because the laser beam need only provide sufficient heat energy to effect a change in the absorption coefficient of one of the thin film components of the interference filter memory instead of heat energy sufficient to vaporize a metal or change the physical state of a material. Further regarding heat energy requirements, the interference device can be designed to have a low reflectivity at the writing beam wavelength and accordingly a large percentage of the write beam energy is utilized for information recording. The error checking capability can be effected, for example, by utilizing dual read lasers, each of a wavelength corresponding to one of the interference fringes of a heated portion of the interference filter. The amount of light transmitted at each write laser wavelength will provide a comparison for error checking and hence a better indication of a reading error than a system using only one read beam. The long shelf life feature is possible without a coating of a protective layer since the interference filter components do not oxidize readily in the atmosphere. If a protective layer is desired, it can be applied uniformly to the outer layer of the interference filter since that layer is free of ablated portions and will readily receive a protective layer of uniform thickness.

BRIEF DESCRIPTION OF THE DRAWINGS

FIGS. 2-9 are schematic representations of optical parameters of optical storage mediums in accordance with the invention.

DETAILED DESCRIPTION OF THE INVENTION

A. Optical System

Figure 1:
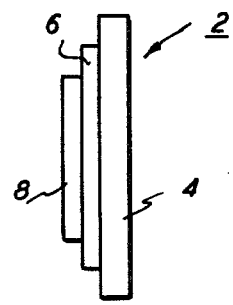
FIG. 1 is a schematic representation of an optical storage medium in accordance with the invention.

Referring to FIG. 1, there is shown schematically one form of an interference type optical storage medium 2 in accordance with the invention. Medium 2 is comprised of a substrate 4, of glass, for example, which supports a thin layer 6 of a light reflective material such as the metals aluminum or gold, for example. Layer 6 supports a thin film 8 of a material capable of having the optical constants of discrete portions thereof changed when sufficient heat is applied to those portions. Film 8 can be an amorphous material such as, for example, a film of the Ge-Se-S-Te family of alloys including GeSe, GeSe$_2$ and Ge$_2$Se$_3$.

In general, the reflectivity of the lamellar structure of FIG. 1 when viewed from the optical film side at normal incidence will exhibit a number of maxima and minima as a function of incident wavelength. A typical example is given by the solid curve in FIG. 2. As is well known, this behavior results from the constructive or destructive interference between light reflected from the top interface and light reflected from the film-metal interface which re-emerges from the film. The details of this curve depend on the following properties: n—the index of refraction of the film; t—the film thickness; $\alpha$—the power absorption coefficient of the film; $\rho$—the electric field reflectivity at the metal-film interface; and $\phi$ the phase shift at the metal-film interface. Except for t, the above properties may be a function of the incident wavelength $\lambda_0$. If, now, one of the above parameters is changed, then the reflectivity might appear as shown by the segmented line in FIG. 2. The changes in reflectivity which occur can be used for the storage of information. It is necessary to make clear the role of each of the important parameters since it is crucial in this description to understand the effect of a change in both $\alpha$ and n.

The power reflectivity of the structure shown in FIG. 1 is given by:

$$R = |A|^2 \qquad (Eq.1)$$

where $$A = \frac{(1 + u) iK_0 - (1 - u)(iK_0 n - \alpha/2)}{(1 + u) iK_0 + (1 - u)(iK_0 n - \alpha/2)}$$

and $$K_0 = 2\pi/\lambda_0$$

and $$u = \rho e^{i\phi} e^{-\alpha t} e^{i 2 K_0 n t}$$

The principles governing the interference phenomena which are encompassed by equation (1) are well known both theoretically and in practice even for multi-element devices. For example, the operation and construction of various interference filters is set out in U.S. Pat. Nos. 3,039,362, 3,247,392, 3,271,179, 3,423,147, 3,556,640 and 3,914,023.

To simplify the discussion it is assumed that the phase shift $\phi$ is 180°. If it is further assumed that all parameters of the film and metal are held constant, then the reflectivity dispersion will exhibit minima at wavelengths given by:

$$\lambda \text{minima} = 2nt/(m + \tfrac{1}{2}) \qquad (Eq.2)$$

wherein m = 0,1,2,3 ...

Figure 3:
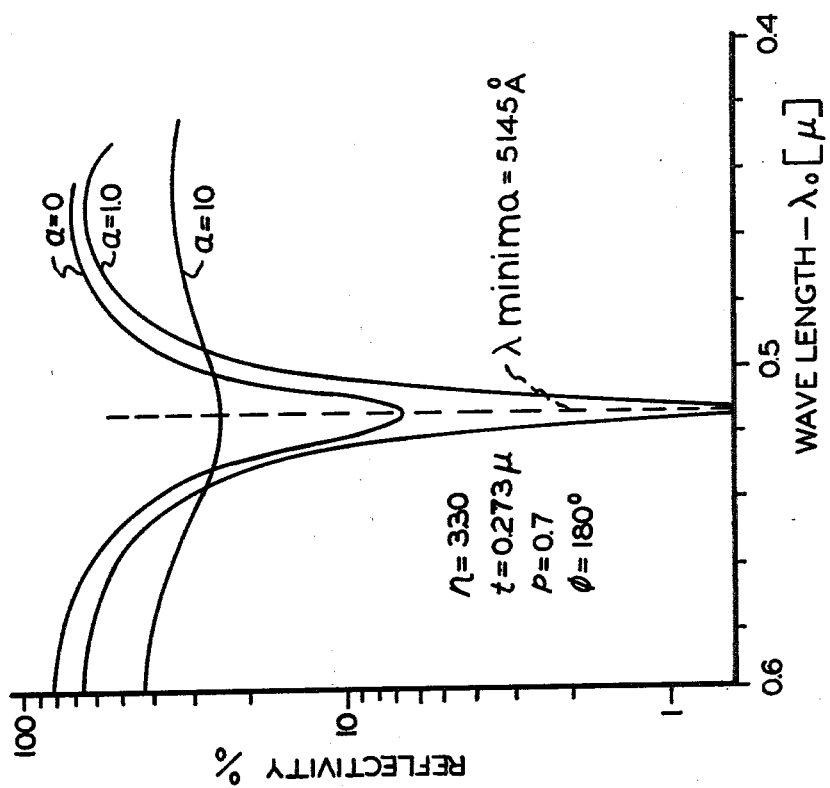

FIG. 3 depicts schematically the evaluation of equation (1) for an interval in $\lambda_0$ about the minima for m = 3 given by equation (2). All curves were evaluated at one value of n and t, and each curve represents a particular value of $\alpha$. First, it should be noted that the reflectivity changes significantly depending on the value of $\alpha$. Second, there is a critical value of $\alpha$, which causes R to go to zero at $\lambda = \lambda_{minima}$, whereas all $\alpha$ values higher and lower have finite reflectivities at $\lambda = \lambda_{min}$.

In optical systems of concern here, only a few wavelengths will be important. Thus, it is more convenient to replot the data of FIG. 3 as shown schematically in FIG. 4, where, again, all results are at constant n and t but now each curve is at constant wavelength with reflectivity as a function of $\alpha$. Let us say information is to be detected by means of an optical system operating at wavelength $\lambda_1$ in FIG. 4. Then depending on the initial and final $\alpha$ value, the altered region of the storage medium may appear in some cases dark or in others light against the background or may exhibit no contrast at all. For example, in FIG. 4, let $\alpha_1$ be the initial absorption and $\alpha_2$ the final absorption value. This would result in the "written" spot being detected as a dark region on a light background.

In general, the absorbing film may undergo both a change in the index of refraction and the absorption coefficient $\alpha$. The results of such a dual change are shown schematically in FIG. 5. Again, both curves give the reflectivity as a function of a $\alpha$ constant wavelength, but now the two curves differ only in the index n. Suppose the initial condition of the film is $\alpha = \alpha_1$ and $n = n_1$ and the final or "written" condition is $\alpha = \alpha_2$ and $n = n_2$. This again results in a contrast of the same type as the previous example but larger both in contrast ratio and initial reflectivity, i.e., the performance of the medium has been improved.

In practical optical memory systems one or more lasers may be used. One could be used to power the information storage or writing system; another might power the information retrieval or read system; still another might power the optical focusing system; or one laser could be used to power any two or all three of the above systems. By considering FIG. 4, it will be seen that this invention is very adaptable to any of the above situations. The writing system might operate at wavelength $\lambda_2$ with an R of 0.25, giving a 75% efficiency for the writing laser. At wavelength $\lambda_3$, R is high and virtually no change in R occurs, so that a focusing system operating at $\lambda_3$ would not be perturbed by the written information; also, imperfections in the storage medium can be detected at $\lambda_3$ since information is invisible but most imperfections are not.

B. Thin Film Materials

The requirements of suitable materials for the absorbing film 8 are many and include the following: (1) of crucial importance is the ability of the film material to undergo a permanent change in its optical constants induced by means of a focused, pulsed laser beam, say, for example, due to heating of the film; (2) the material must be capable of being formed into films of the required thickness and thickness uniformity to make the invention possible on a practical basis; (3) the material must have sufficient mechanical durability; (4) the material in either of its two states must have sufficient temporal stability in terms of its optical and thermal response to permit "reading" and/or writing during some useful lifetime. We have discovered a large class of such materials and, in particular, prefer evaporated or sputtered films of alloys in the system Ge-Se-S-Te.

Figure 6:
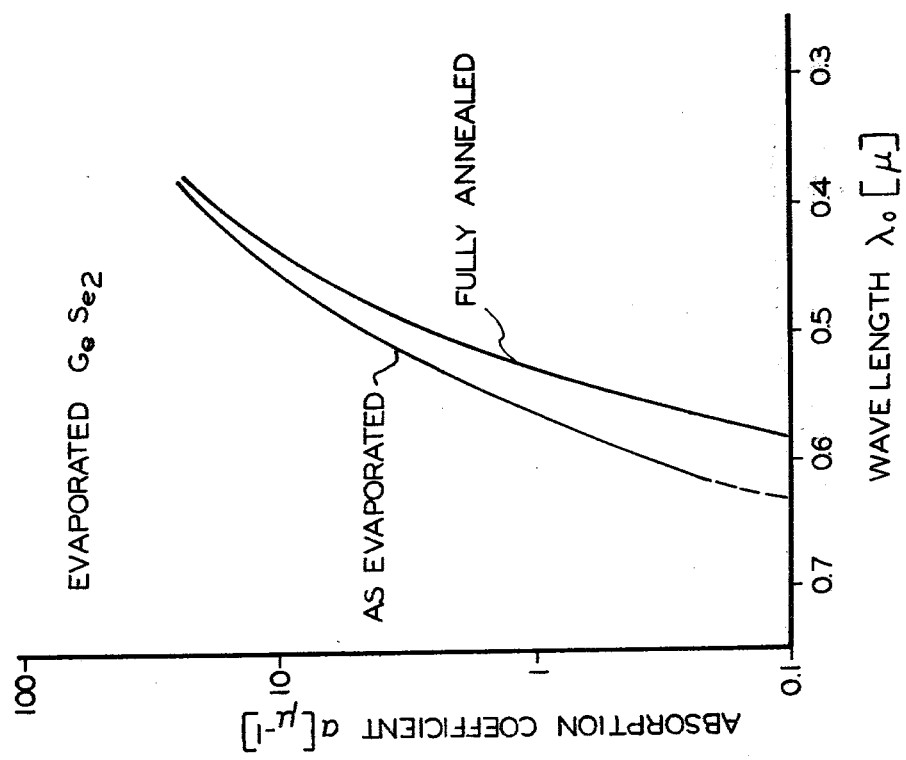

In general, most materials possess a wavelength-dependent absorptivity $\alpha$. While this dispersion in $\alpha$ is not required by the invention, as is evident from FIG. 3, it is a complexity which arises in many materials. For example, absorption coefficient measurements have been made on evaporated thin films made from alloys in the system Ge-Se. When these films are heated or annealed, they exhibit the required change in $\alpha$. An example is shown in FIG. 6 for a film of composition $GeSe_2$. It will be noted that each curve possesses an absorption edge, i.e., it rises steeply at some point with decreasing wavelength. In fact, the Se content of a film can be varied continuously from about 45%–100% Se, producing what is commonly considered to be an amorphous film. This fact is very useful since, for most wavelengths in the visible (0.7–0.4$\mu$), a composition can be found having a useful range of $\alpha$ values. It should be noted here that, for each composition, crystalization of the films occurs for different annealing temperatures and times beyond a critical point, whereas for annealing below these critical values, the optical quality of the film is maintained.

Figure 2:
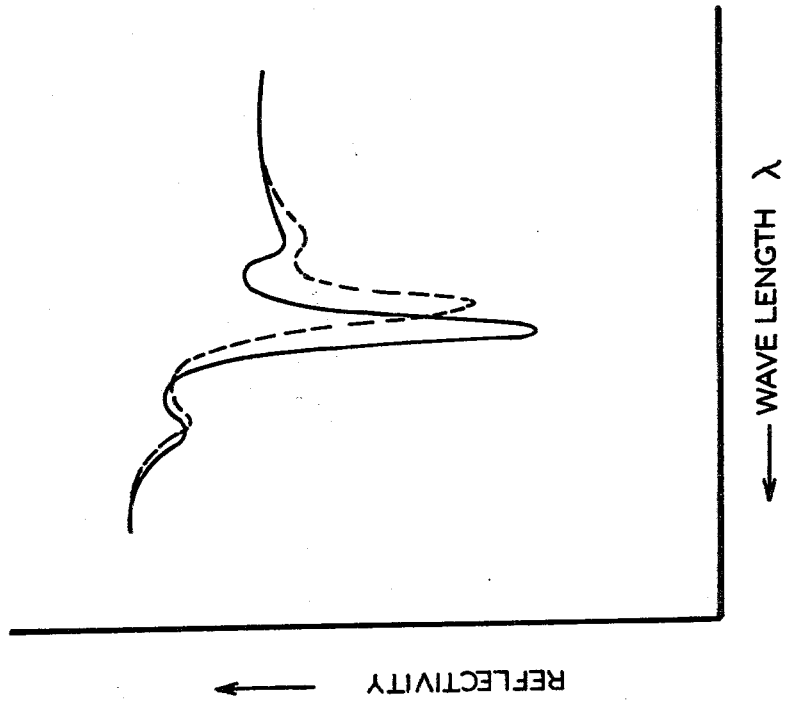

By use of data such as contained in FIG. 6 and other information such as the index n as a function of wavelength, one can calculate reflectivity dispersion curves such as shown in FIG. 2 which agree well with actual measured curves. Thus, one versed in the state of the art is able to design optical storage media with the proper wavelength response for most wavelengths in the visible.

It has also been determined that these materials may undergo changes in the index n as well as those in $\alpha$ as a result of annealing without crystallization. It is further recognized that by itself an index change of a sufficient magnitude could be utilized in a practical optical storage medium. In fact, when both changes occur in an absorbing film, one is able to take advantage of both effects and produce a storage medium operating in a more useful reflectivity range (i.e., higher) and having a contrast ratio greater than either effect alone may produce. This is demonstrated by the results previously explained in regard to FIG. 5.

The parameters of the metal reflector ($\rho$ and $\phi$) are also useful engineering parameters and can be selected from a wide range to optimize further any particular storage medium. This is because a large range of metal or metal-alloy films can be deposited by evaporation or sputtering or some plating process having the required mechanical and thermal properties.

Figure 7:
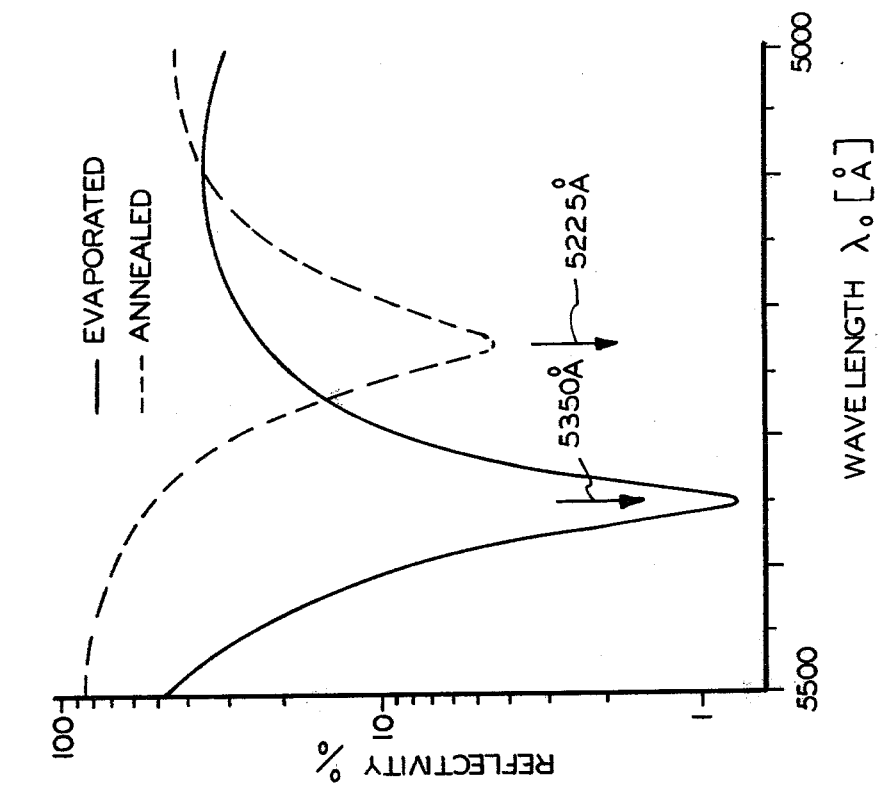

As a specific example of an optical storage system utilizing the interference fringe wavelength shifting concept of the invention, an aluminum layer having a uniform thickness of about 600–800 Å was deposited on a glass substrate by conventional vacuum evaporation techniques, and a 0.52 micron thick film of $GeSe_2$ was deposited on the aluminum layer by the same conventional vacuum evaporation techniques, as discussed in U.S. Pat. No. 3,271,179. As shown by the solid curve of FIG. 7, that structure had a very deep interference fringe (a reflectivity of less than 1%) at a wavelength of about 5350 Å. Annealing that structure at 275° C. for about two minutes caused the deep interference fringe to shift from 5350 Å to 5225 Å, as shown by the segmented curve of FIG. 7. A comparison of the curves of FIG. 7 shows that the reflectivity at 5350 Å has increased when the structure was annealed from less than 1% to about 50%. Thus, an optical contrast of fifty to one occurs at the read frequency of 5350 Å. That is, the sample appears to go from black to white as viewed in reflection by a read beam at 5350 Å after annealing and appears to go from white to black when viewed in reflection after annealing by a read beam at 5225 Å. In general, other wavelengths show useful contrast ratios of differing magnitudes.

Figures 8, 9:
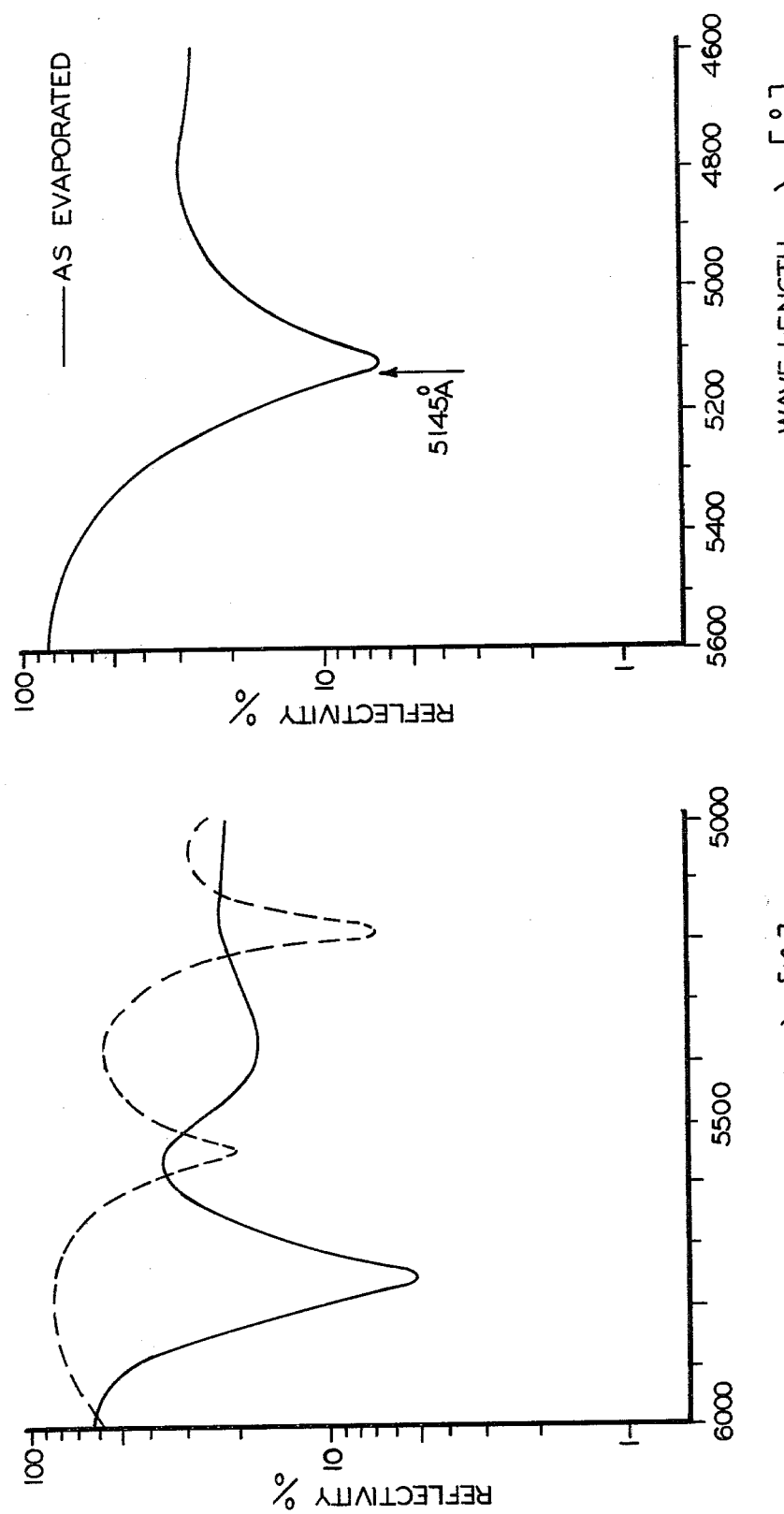

FIG. 8 shows the spectral reflectivity changes of another experimental optical memory structure comprised of a 0.95 micron thick film of $GeSe_2$ deposited on an almost opaque layer of gold, the structure being processed as previously described in relation to FIG. 7. As shown by FIG. 8, annealing at 275° C. for two minutes produces significant shifts of the interference fringes from their location when the film was freshly evaporated.

In yet another experimental optical storage structure, a 0.40 micron thick film of $GeSe_2$ was evaporated on an opaque layer of aluminum. The reflectivity characteristics of this sample are shown by FIG. 9. This sample was locally heated with a focused, pulsed (approximately 100 nanoseconds) argon laser beam at 5145 Å. Various intensities of the argon laser beam were established so that the sample was locally heated to different temperatures. Scanning electron microscopy revealed, as expected, that at high laser beam intensities the $GeSe_2$ film had been melted and/or ablated. At low laser beam intensities, however, no damage or surface modification could be detected. When these "non-damaged" but thermally annealed areas were examined by optical microscopy, in reflection, using monochromatic light at 5145 Å, the expected optical image was clearly evident.

It should be pointed out that in general three useful cases exist concerning this invention. The first is the one mainly discussed up to this point, namely, that the storage medium possesses a deep reflectivity minimum which shifts to a different wavelength in the "written" condition. The second is the case where a shallow or imperceptible minimum is initially present in the medium and develops into a deep minimum in the "written" condition. The third case is simply the reverse of the second, namely, a deep minimum changing to a shallow minimum in the "written" condition.

It is again noted that when the film 8 is "tuned" to a write laser frequency the reflectivity is very low and that energy losses by reflection do not occur. Also, film 8 need only be heated and latent heat of fusion and/or vaporization need not be supplied. Also, the transformation, as determined by differential thermal analysis, for GeSe and GeSe$_2$ is exothermic so that less than pV Cp ΔT need be supplied by the write laser. For a 0.4 micron thick GeSe$_2$ film, a one micron diameter focused laser with a 20 nanosecond pulse width, T=300° C. (typical for these materials), we estimate a power requirement of about six milliwatts as follows:

$$P = \frac{C_p V \Delta T}{\Delta t}$$

$$V = \frac{\pi D^2}{4} \Delta X = \frac{\pi (10^{-4})^2 (4 \times 10^{-5})}{4} \text{ cm}^3$$

$$\rho = 4 \text{ g/cm}^3$$
$$\Delta T = 300° C.$$
$$C_p \approx \frac{3R}{\text{Mavg.}} \approx \frac{3R}{75}$$

$$P = \frac{3 \times 1.98 \frac{\text{cal}}{\text{mole }°C.}}{75 \text{ g/mole}} \cdot \frac{\pi (10^4)^2 (4 \times 10^{-5})}{4} \text{ cm}^3 \cdot \frac{4 \text{ g}}{\text{cm}^3} \cdot \frac{300° C.}{20 \times 10^{-9} \text{ sec.}}$$

$$= 0.0015 \frac{\text{cal}}{\text{sec}} \quad 1 \frac{\text{cal}}{\text{sec}} = 4.18 \text{ watts}$$
$$= 6.3 \text{ mwatt}$$

The above calculation assumes a heat capacity of about 0.08 calories per g C which may be slightly low and ignores heat losses which may occur before the material transforms. However, it does not include the heat which is liberated during the transformation so that on balance the calculated sensitivity of this transformation is thought to be realistic. Thinner films, of course, would further reduce power requirements.

Figure 10:
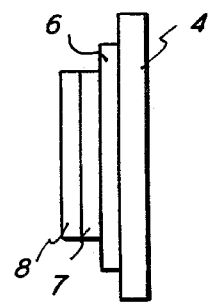
FIG. 10 is a schematic representation of another optical storage medium in accordance with the invention.

Interference filter structures comprised of more than two thin films or layers are also contemplated by the invention. For example, as shown in FIG. 10 (wherein materials corresponding to those of FIG. 1 have the same reference numerals) the interference filter can be comprised of a substrate 4, a reflective film 6, a non-absorbing layer (α=O) 7, and an absorbing "active" layer 8. Layer 7 could be an evaporated or sputtered oxide such as SiO$_2$. Such a structure would allow layer 8 to be very thin since a highly absorbing material with the required transformation could be used. Reflectivity minima can still be achieved due to the phase shifts occurring in layer 7. The net result would be an increase in sensitivity of the storage medium.

Figure 11:
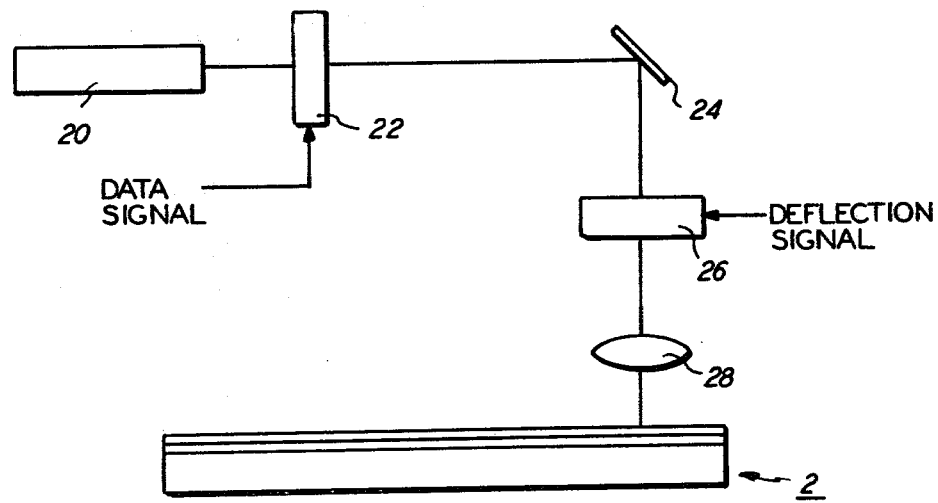
FIG. 11 is a schematic representation of a laser scanning system for utilization with the optical storage medium of the invention.

The heating of discrete regions of the interferenc filter optical memory can be achieved by conventional laser scanning techniques as depicted by FIG. 11. A high energy, collimated light beam, such as produced, for example, by a helium-neon laser 20 is incident upon a modulator 22, such as one of the Pockels cell type, which amplitude modulates a laser light beam in accordance with the data signal supplied to the modulator. A mirror 24 directs the modulated light beam upon an electrically driven acousto-optic modulator 26 which deflects (diffracts) the modulated light beam in a predetermined direction when the modulated light beam is incident on the acousto-optic modulator near the Bragg angle. After focusing by a writing lens 28 the amplitude modulated (pulsed) light beam is incident upon the optical storage structure 2 as described previously.

What is claimed is:

1. An optical storage medium comprising a layered optical storage structure, said storage structure having prior to heating, a given optical absorption spectrum exhibiting a maxima and minima reflectivity at one or more wavelengths, means for heating said structure to a temperature sufficient to cause a measurable change in the absorption spectrum providing a corresponding change in the reflectivity spectrum at said given wavelengths without any appreciable change in the index of refraction thereof.

2. The optical storage medium of claim 1 wherein said storage structure includes a support substrate, a metallic layer supported by said substrate, and a film alloy of the Ge-Se-S-Te group supported by said metallic layer.

3. The optical storage medium of claim 1 wherein said storage structure includes a support substrate and a film alloy of the Ge-Se-S-Te group supported by said substrate.

4. The optical storage medium of claim 1 wherein there is no change in the index of refraction at said temperature.

5. The optical storage system of claim 4 wherein said optical storage structure includes a metallic layer and a film alloy of the Ge-Se-S-Te group supported by said metallic layer.

6. The optical storage medium of claims 1 or 4 wherein said storage structure is a non-crystalline material and the temperature sufficient to cause a measurable change in the absorption spectrum is below critical values sufficient to cause and devitrification of said storage structure.

7. An optical storage system comprising a layered optical storage structure which exhibits maxima and minima reflectivity positions as a function of one or more given wavelengths and means for shifting the wavelengths of said reflectivity positions at selected positions on said storage structure by changing the optical absorption spectrum of said structure without any appreciable change in the index of refraction at said selected positions thereby producing an optically detectable pattern.

8. The optical storage system of claim 7 wherein at least two given wavelengths are present, means to correlate changes in absorption at one said wavelength simultaneaously with absorption changes at the other of said wavelengths to permit discrimination of foreign material on or defects in said optical storage structure from said detectable selected positions.

9. The optical storage system of claim 7 wherein said shifting means is annealing at said selected positions by a laser beam source.

10. The optical storage medium of claim 7 wherein there is no change in the index of refraction at said temperature.

11. The method of recording an optically detectable pattern on an optical storage medium comprising the steps of applying a modulated annealing means to the surface of medium changing the optical absorption spectrum of the medium at selected positions thereon without appreciably changing the index of refraction thereof thereby providing a change in reflectivity at said positions as a function of one or more given wavelengths.

* * * * *